(12) United States Patent
Tomioka

(10) Patent No.: US 12,171,123 B2
(45) Date of Patent: Dec. 17, 2024

(54) DISPLAY DEVICE

(71) Applicant: Japan Display Inc., Tokyo (JP)

(72) Inventor: Yasushi Tomioka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/503,242

(22) Filed: Nov. 7, 2023

(65) Prior Publication Data

US 2024/0074264 A1 Feb. 29, 2024

Related U.S. Application Data

(63) Continuation of application No. 16/953,628, filed on Nov. 20, 2020, now Pat. No. 11,849,609, which is a continuation of application No. PCT/JP2019/019405, filed on May 15, 2019.

(30) Foreign Application Priority Data

Jun. 6, 2018 (JP) .................................. 2018-108798

(51) Int. Cl.
*H10K 59/131* (2023.01)
*H10K 59/122* (2023.01)
*H10K 59/124* (2023.01)

(52) U.S. Cl.
CPC ......... *H10K 59/131* (2023.02); *H10K 59/122* (2023.02); *H10K 59/124* (2023.02)

(58) Field of Classification Search
CPC .............................. H10K 59/131; H10K 59/12
See application file for complete search history.

(56) References Cited

U.S. PATENT DOCUMENTS

| | | | |
|---|---|---|---|
| 11,849,609 B2 * | 12/2023 | Tomioka | H10K 59/873 |
| 2016/0174304 A1 | 6/2016 | Kim et al. | |
| 2017/0148859 A1 | 5/2017 | Nishinohara | |
| 2017/0237025 A1 | 8/2017 | Choi et al. | |
| 2018/0083072 A1 | 3/2018 | Kwon et al. | |
| 2021/0074795 A1 | 3/2021 | Tomioka | |

FOREIGN PATENT DOCUMENTS

| | | |
|---|---|---|
| EP | 3000659 A1 | 3/2016 |
| JP | 2016068926 A | 5/2016 |
| JP | 2017098020 A | 6/2017 |

OTHER PUBLICATIONS

International Search Report issued Jul. 9, 2019 in PCT/JP2019/019405 filed May 15, 2019, 2 pages.
Japanese Office Action issued May 24, 2022 in Japanese Patent Application No. 2018-108798 (submitting unedited computer generated English translation only), 4 pages.

* cited by examiner

*Primary Examiner* — Mark V Prenty
(74) *Attorney, Agent, or Firm* — Maier & Maier, PLLC

(57) ABSTRACT

According to one embodiment, a display device including, a substrate including a first area including a display area, a second area including a mount area, and a third area located between the first area and the second area, a first inorganic insulating layer provided on the substrate in the first area and the second area, a line provided on the first inorganic insulating layer and extending across the first area, the second area, and the third area, and, a second inorganic insulating layer provided on the line, the second inorganic insulating layer extending to an area overlaid on at least the first inorganic insulating layer.

10 Claims, 11 Drawing Sheets

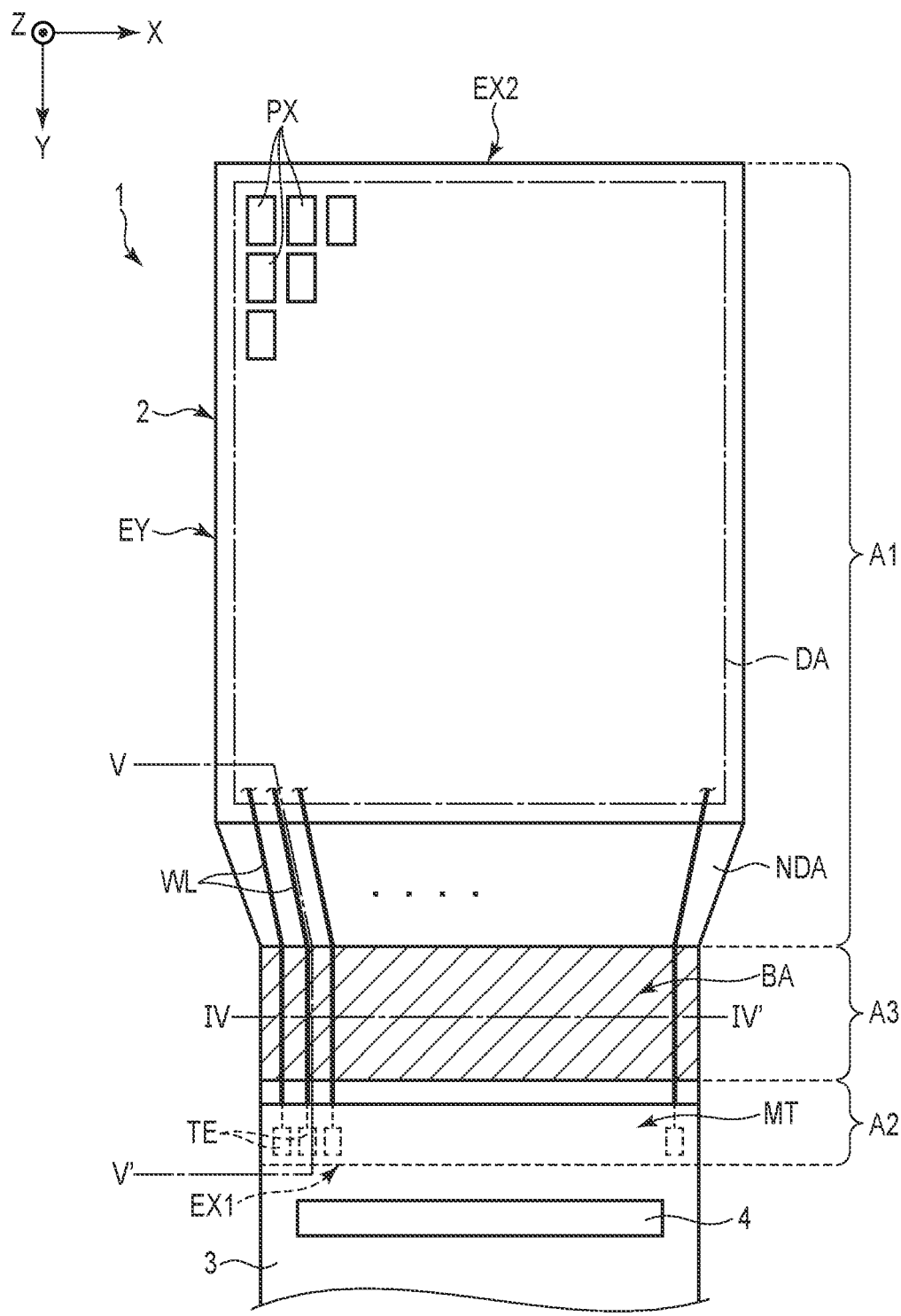
F I G. 1

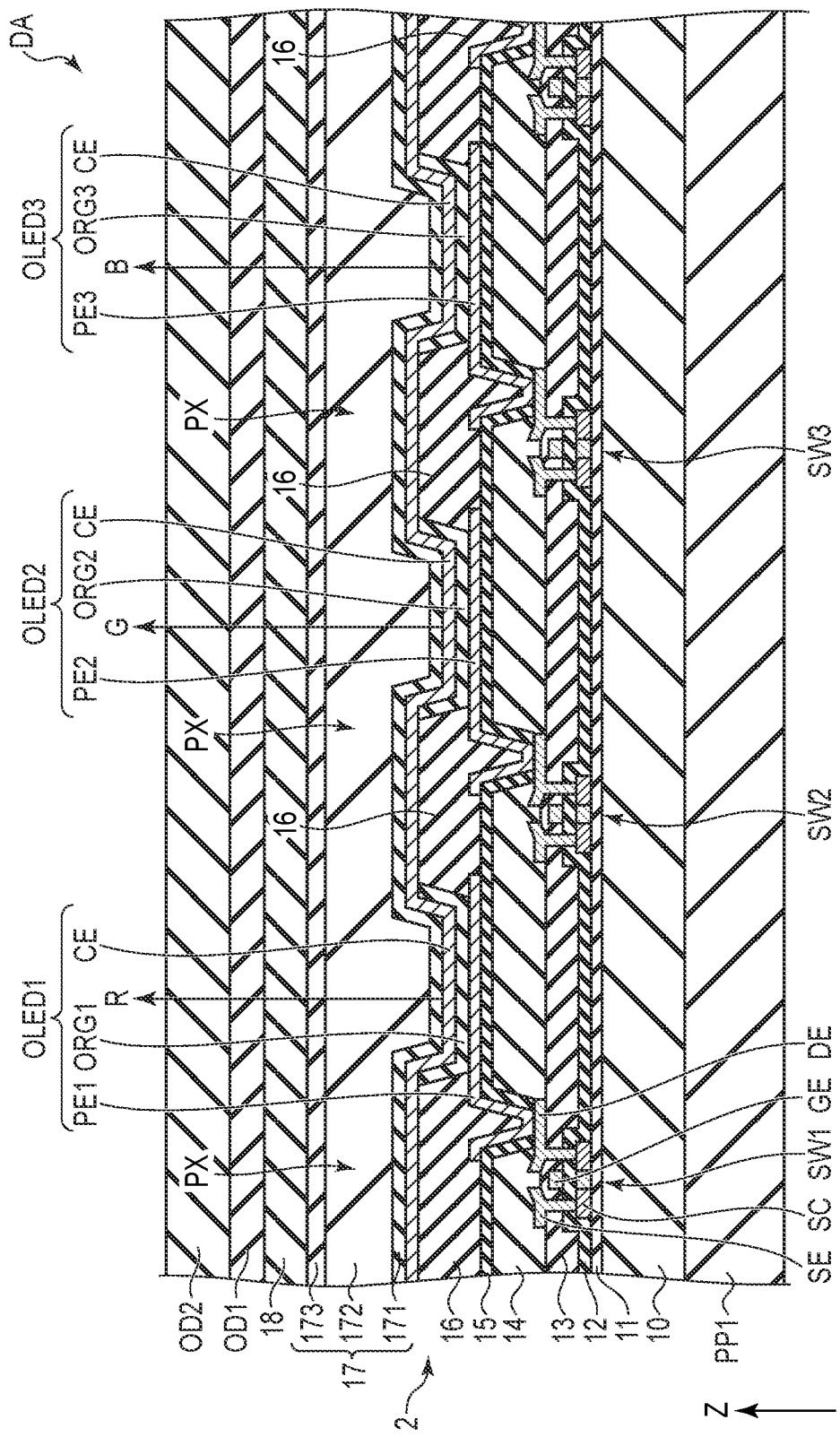
F I G. 3

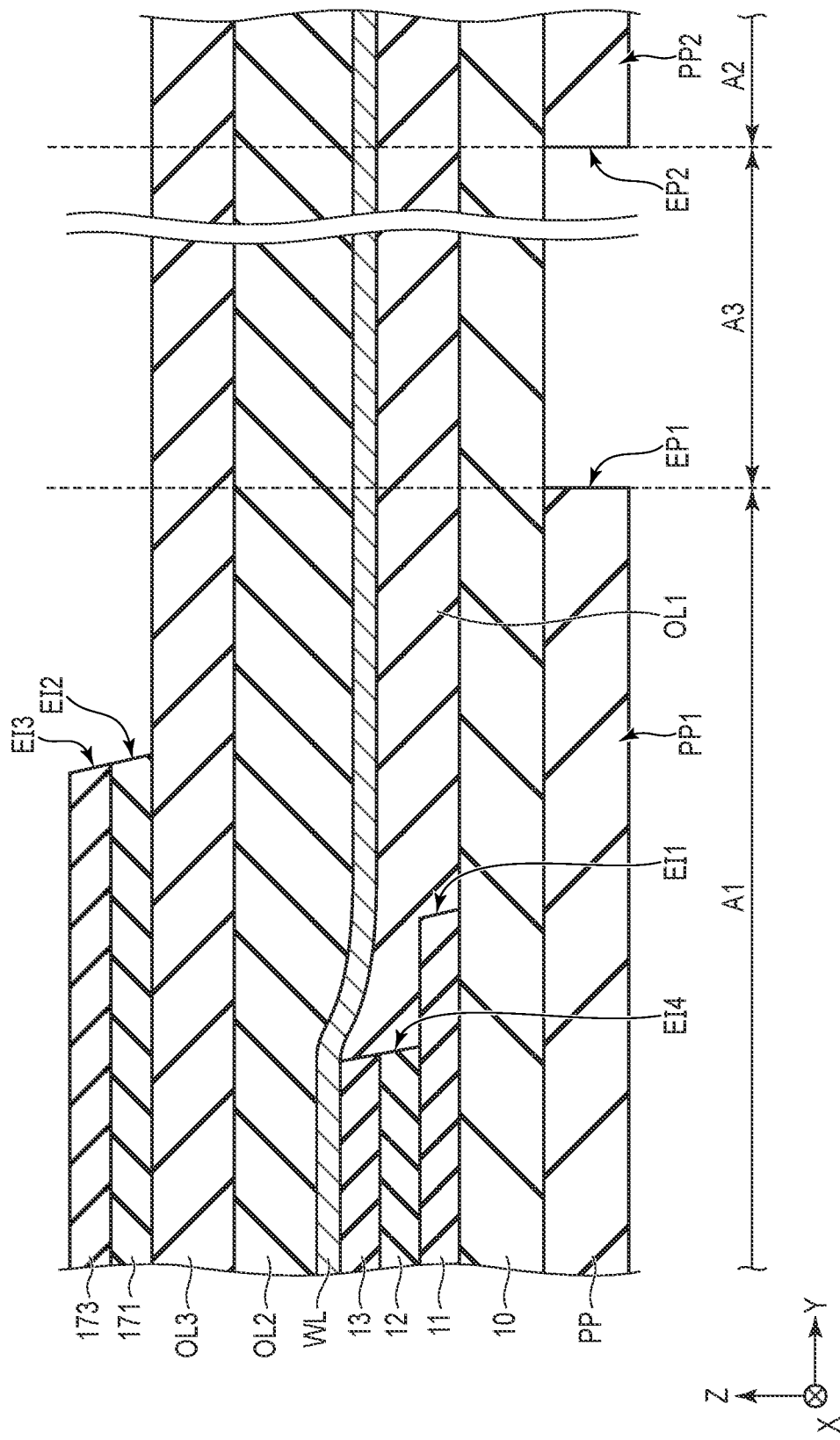
F I G. 6

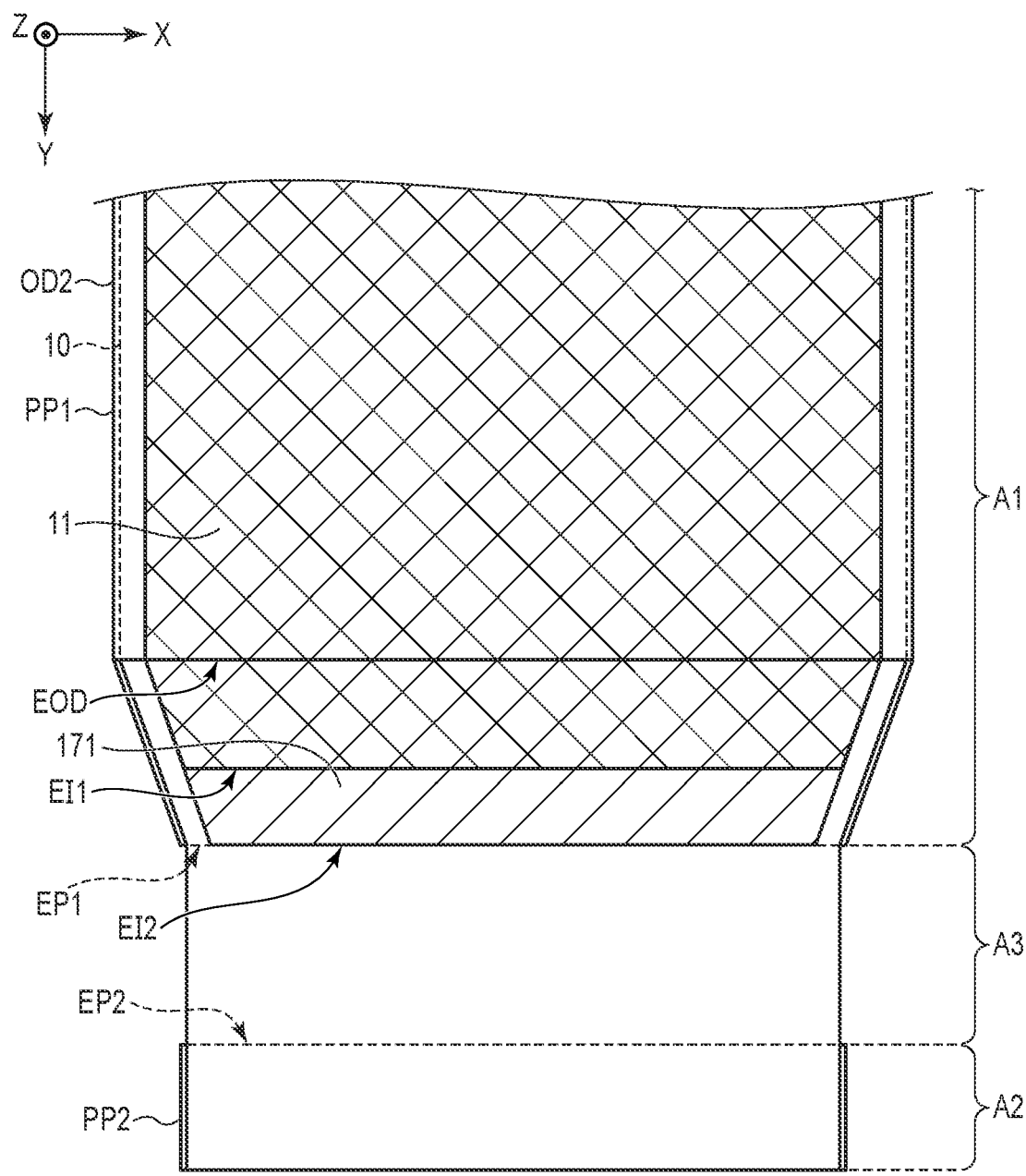
F I G. 9

DISPLAY DEVICE

CROSS-REFERENCE TO RELATED APPLICATIONS

This application is a Continuation of U.S. patent application Ser. No. 16/953,628, filed Nov. 20, 2020, which is a Continuation of Application of PCT Application No. PCT/JP2019/019405, filed May 15, 2019, and based upon and claiming the benefit of priority from Japanese Patent Application No. 2018-108798, filed Jun. 6, 2018, the entire contents of all of which are incorporated herein by reference.

FIELD

Embodiments described herein relate generally to a display device.

BACKGROUND

A display panel used for a cell phone, a personal digital assistant (PDA), etc., is partially folded from the viewpoint of performance, design, etc., in some cases. When an area where lines are arranged is folded, a stress to the lines becomes large. As a result, the lines may be broken due to impulse caused by contact with the lines, temperature variation, etc., and there is a risk that the reliability of the display device may be lowered.

BRIEF DESCRIPTION OF THE DRAWINGS

FIG. 1 is a schematic perspective view showing a display device 1 according to the present embodiment.

FIG. 3 is a cross-sectional view showing a display area DA shown in FIG. 1.

FIG. 6 is an enlarged cross-sectional view showing a vicinity of a third area A3 shown in FIG. 5.

FIG. 9 is a plan view showing the display panel 2 shown in FIG. 8.

DETAILED DESCRIPTION

Figure 2:
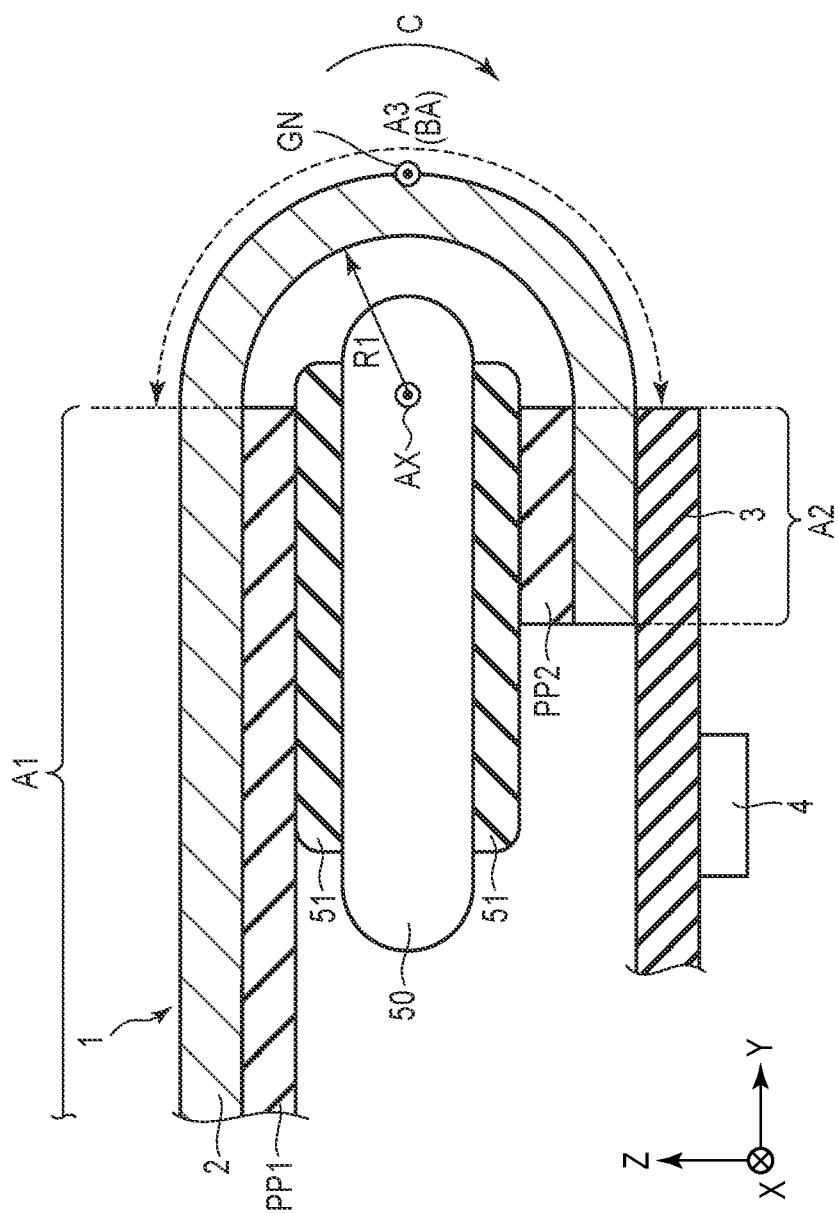
FIG. 2 is a view showing a state in which a fold area BA shown in FIG. 1 is folded.

In general, according to one embodiment, there is provided a display device comprising: a substrate including a first area including a display area, a second area including a mount area, and a third area located between the first area and the second area; a first inorganic insulating layer provided on the substrate in the first area and the second area; a line provided on the first inorganic insulating layer and extending across the first area, the second area, and the third area; and a second inorganic insulating layer provided on the line, the second inorganic insulating layer extending to an area overlaid on at least the first inorganic insulating layer.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a plan view schematically showing a display device 1 according to the present embodiment. In the present embodiment, an example of the display device 1 is an organic EL display device comprising organic electroluminescent (EL) elements. However, the display device 1 may be the other display device such as a liquid crystal display device comprising a liquid crystal layer or an electronic paper display device comprising electrophoretic elements and the like.

A first direction X, a second direction Y and a third direction Z shown in the drawing are orthogonal to each other. Incidentally, the first direction X, the second direction Y, and the third direction Z may be orthogonal to each other at an angle other than ninety degrees. In the present specification, a direction forwarding a tip of an arrow indicating the third direction Z is referred to as upward and a direction forwarding oppositely from the tip of the arrow is referred to as downward. According to "a second member above/on a first member" and "a second member below/under a first member", the second member may be in contact with the first member or may be separated from the first member. In the latter case, a third member may be interposed between the first member and the second member. In addition, an observation position at which the display device 1 is observed is assumed to be located on the tip side of the arrow indicating the third direction Z, and viewing from the observation position toward the X-Y plane defined by the first direction X and the second direction Y is referred to as a planar view.

The display device 1 comprises a display panel 2, a wiring substrate 3, and the like. The display panel 2 has a shape in which a length along the second direction Y is larger than a length along the first direction X. In the example depicted, the display panel 2 has sides EX1 and EX2 along the first direction X and a side EY along a second direction Y. The sides EX1 and EX2 are shorter than the side EY. In addition, the side EX1 is shorter than the side EX2.

The display panel 2 includes a display area DA on which an image is displayed, and a non-display area NDA located outside the display area DA. For example, the display area DA is substantially shaped in a rectangle having a pair of longer sides along the second direction Y and a pair of shorter sides along the first direction X. The display area DA includes a plurality of pixels PX arrayed in a matrix. As described later, the pixel PX includes an organic EL element, a switching element for driving the organic EL element, etc.

In addition, the display panel 2 includes a mount area MT including terminals TE in the vicinity of the side EX1. The terminals TE and the pixels PX are electrically connected in a one-to-one relationship by lines WL. A power supply potential and a signal potential supplied from an external device are supplied to each of the pixels PX via the terminal TE and the line WL.

The display panel 2 is flexible. For example, the display panel 2 includes a fold area BA in the non-display area NDA as represented by hatch lines in the drawing. The fold area BA corresponds to an area which is folded when the display device 1 is accommodated in the housing or the like. The fold area BA is located between the display area DA and the mount area MT. The line WL makes electric connection between the pixel PX and the terminal TE through the fold area BA.

The wiring substrate 3 is mounted in the mount area MT. The wiring substrate 3 is electrically connected to the display panel 2 via the terminal TE. The wiring substrate 3 is, for example, a flexible printed circuit. In the example illustrated, the wiring substrate 3 is equipped with an IC chip 4 for driving the pixel PX. Incidentally, the IC chip 4 may be mounted on the display panel 2. In the example illustrated, a length of a side along the first direction X of the wiring substrate 3 is equivalent to that of the side EX1 but may be different therefrom.

In the present embodiment, the display panel 2 includes a first area A1, a second area A2, and a third area A3. The first area A1 includes the display area DA and corresponds to an area between the side EX2 and the fold area BA. The second area A2 includes the mount area MT and corresponds to an area between the fold area BA and the side EX1. The third area A3 is an area between the first area A1 and the second area A2. In the example illustrated, the third area A3 corresponds to the fold area BA.

FIG. 2 is a view showing a state in which a fold area BA shown in FIG. 1 is folded. FIG. 2 shows a surface parallel to a Y-Z plane. Constituent elements necessary for explanations alone are shown in the figure. The display device 1 comprises a support substrate PP (PP1 and PP2), a support member 50, an adhesive 51, and the like in addition to the display panel 2 and the wiring substrate 3.

The support substrate PP is provided on a surface of an opposite side to the display surface of the display panel 2 except the third area A3 (i.e., the fold area BA). The first area A1 corresponds to an area where a support substrate PP1 is stuck on the display panel 2. The second area A2 corresponds to an area where a support substrate PP2 is stuck on the display panel 2. The third area A3 corresponds to an area where the support substrates are not provided, i.e., an area between the support substrate PP1 and the support substrate PP2.

The support substrate PP functions as, for example, a support layer which suppresses curving of the display panel 2 in the display area DA and the mounting area MT. In addition, the support substrate PP has a moisture excluding property of suppressing entry of moisture or the like to the display panel 2 and a gas blocking property of suppressing entry of gas, and also functions as a barrier layer. The support substrate PP is, for example, a film formed of polyethylene terephthalate. Incidentally, the other thin film may be interposed between the support substrate PP and the display panel 2.

The display panel 2 is folded to sandwich the support member 50 and is stuck on the support member 50 by the adhesive 51. In the example illustrated, the support substrate PP1, the support substrate PP2, and the adhesive 51 are in contact with each other. In a state where the third area A3 is folded, the wiring substrate 3 is located below the display panel 2 and is opposed and substantially parallel to the display panel 2 and the support member 50. Incidentally, the support member 50 may be omitted.

The fold area BA is folded about a fold axis AX along the first direction X. The third area A3 has a curved surface and is, for example, curved along the circumference. A generator GN of the curved surface formed by the fold area BA is parallel to the fold axis AX. That is, the generator GN of the fold area BA is parallel to the first direction X. A direction from the first area A1 side to the second area A2 side along the curved surface of the fold area BA is defined as a circumferential direction C. In addition, a radius of curvature R1 of the fold area BA is defined as, for example, a distance from the fold axis AX to the inner surface of the display panel 2. For example, the radius of curvature R1 is 0.3 mm.

FIG. 3 is a cross-sectional view showing a display area DA shown in FIG. 1. The display panel 2 comprises an insulating substrate 10, insulating layers 11 to 15, a rib 16, switching elements SW (SW1, SW2, and SW3), organic EL devices OLED (OLED1, OLED2, and OLED3), a sealing film 17, an adhesive layer 18, optical elements OD1 and OD2, and the like. In the example illustrated, the support substrate PP1 is stuck on a lower part of the insulating substrate 10.

The insulating substrate 10 is formed of, for example, an organic insulating material such as polyimide. The insulating layer 11 is formed on the insulating substrate 10. The insulating layer 11 may include a barrier layer to suppress entry of moisture and the like to the organic EL device OLED from the insulating substrate 10. Incidentally, the insulating layer 11 may be omitted. In addition, the insulating substrate 10 may have a multilayer structure including an inorganic insulating material sandwiched between organic insulating materials.

The switching element SW is formed on the first insulating layer 11. The switching element SW is composed of, for example, a thin-film transistor (TFT). In the example illustrated, the switching element SW is a top-gate type switching element, but may be a bottom-gate type switching element. The structure of the switching element SW1 will be exemplified below.

The switching element SW1 comprises a semiconductor layer SC, a gate electrode GE, a source electrode SE, and a drain electrode DE.

The semiconductor layer SC is formed on the insulating layer 11 and is covered with the insulating layer 12. The gate electrode GE is formed on the insulating layer 12 and is covered with an insulating layer 13. Each of the source electrode SE and the drain electrode DE is formed on the insulating layer 13. Each of the source electrode SE and the drain electrode DE is in contact with the semiconductor layer SC through the contact hole which penetrates the insulating layer 13 and the insulating layer 12 to the semiconductor layer SC.

The gate electrode GE may be formed of a metal material such as aluminum, titanium, silver, molybdenum, tungsten, copper or chromium or an alloy formed by a combination of these metal materials, and may be formed to have a single-layer structure or a multi-layer structure. The above metal material can be applied as the material to form the source electrode SE and the drain electrode DE.

Each of the switching elements SW is covered with an insulating layer 14. The insulating layer 14 is covered with the insulating layer 15. The insulating layers 11 to 13 and an insulating layer 15 are formed of an inorganic insulating material such as silicon oxide, silicon nitride, or silicon oxynitride. The insulating layer 14 is formed of, for example, an organic insulating material such as polyimide.

The organic EL elements OLED are formed on the insulating layer 15. In the example illustrated, the organic EL elements OLED are so called a top-emission type of emitting the light to a side opposite to the insulating substrate 10. However, the organic EL elements are not limited to this example, but may be so called a bottom-mission type of emitting the light to the insulating substrate 10 side. For example, an organic EL element OLED1 comprises an organic emitting layer ORG1 emitting a red color, an organic EL element OLED2 comprises an organic emitting layer ORG2 emitting a blue color, and an organic EL element OLED3 comprises an organic emitting layer ORG3 emitting a green color. The structure of the organic EL element OLED1 will be exemplified below.

The organic EL element OLED1 is composed of a pixel electrode PE1, a common electrode CE, and the organic emitting layer ORG1. The pixel electrode PE1 is provided on an insulating layer 15. The pixel electrode PE1 is in contact with the drain electrode DE of the switching element SW1 through a contact hole provided in the insulating layers 15 and 14. The pixel electrode PE1 and the switching element SW1 are thereby electrically connected to each other. The organic emitting layer ORG1 is formed on the pixel electrode PE1. The organic emitting layer ORG1 may further include an electron-injection layer, a hole-injection layer, an electron-transport layer, a hole-transport layer, and the like. The common electrode CE is formed on the organic emitting layer ORG1. The common electrode CE and the pixel electrodes PE are formed of, for example, a transparent conductive material such as indium-tin-oxide (ITO) or indium-zinc-oxide (IZO).

The organic EL element OLED1 constituted as described above emits the light with the luminescence corresponding to the voltage (or the current) applied between the pixel electrode PE1 and the common electrode CE. Incidentally, the organic EL element OLED1 in the top-emission type desirably includes a reflective layer between the insulating layer 15 and the pixel electrode PE1, though not illustrated. The reflective layer is formed of, for example, a high-reflectance metallic material such as aluminum or silver. Incidentally, the reflective surface of the reflective layer, i.e., the surface on the organic emitting layer ORG1 side may be flat or may be uneven to impart an optical scattering property.

Each organic EL element OLED is sectioned for each pixel PX by ribs 16 formed of an organic insulating material. The ribs 16 cover both end portions of each pixel electrode PE and are in contact with the insulating layer 15. The ribs 16 are formed of, for example, polyimide. The organic emitting layers ORG1, ORG2, and ORG3 are in contact with the pixel electrodes PE1, PE2, and PE3, respectively, in areas where the ribs 16 are not provided. The common electrode CE is formed over the whole body of the display area DA. That is, the common electrode CE is in contact with the organic emitting layers ORG1, ORG2, and ORG3 and covers the ribs 16.

Incidentally, the display panel 2 may comprise a common organic emitting layer over a plurality of pixels PX. In such a structure, the display panel 2 comprises a color filter at a position opposed to each organic EL element OLED. The color filter is formed of, for example, resin materials colored in red, green, blue, etc.

The sealing film 17 covers the organic EL elements OLED. The sealing film 17 suppresses entry of moisture and oxygen into the organic EL elements OLED and suppresses degradation of the organic EL elements OLED. The sealing film 17 comprises an inorganic layer 171, an organic layer 172, and an inorganic layer 173. The inorganic layer 171 is formed on the organic EL elements OLED. In the example illustrated, the inorganic layer 171 is in contact with the common electrode CE. The inorganic layer 173 is located above the inorganic layer 171. The organic layer 172 is located between the inorganic layer 171 and the inorganic layer 173 and is in contact with both the inorganic layer 171 and the inorganic layer 173.

The inorganic layer 171 and the inorganic layer 173 of the sealing film 17 comprise a function of mainly blocking intrusion of moisture into the organic EL element OLED sides. The inorganic layer 171 and the inorganic layer 173 are transparent and are formed of, for example, an inorganic insulating material such as silicon oxide, silicon nitride, or silicon oxynitride. The inorganic layer 171 and the inorganic layer 173 may be formed of the same material or different materials. The insulating layer 172 is formed of a transparent organic insulating material. Incidentally, being transparent allows the transmitted light to be colored in a range of giving no influence to the display.

The optical elements OD1 and OD2 are provided on the sealing film 17. The optical element OD1 is, for example, an optical member such as a retardation film. The optical element OD2 is, for example, an optical member such as a polarizer. In the example illustrated, the optical element OD1 is closer to the sealing film 17 than the optical element OD2 and is bonded to the sealing film 17 by the adhesive layer 18.

Figure 4:
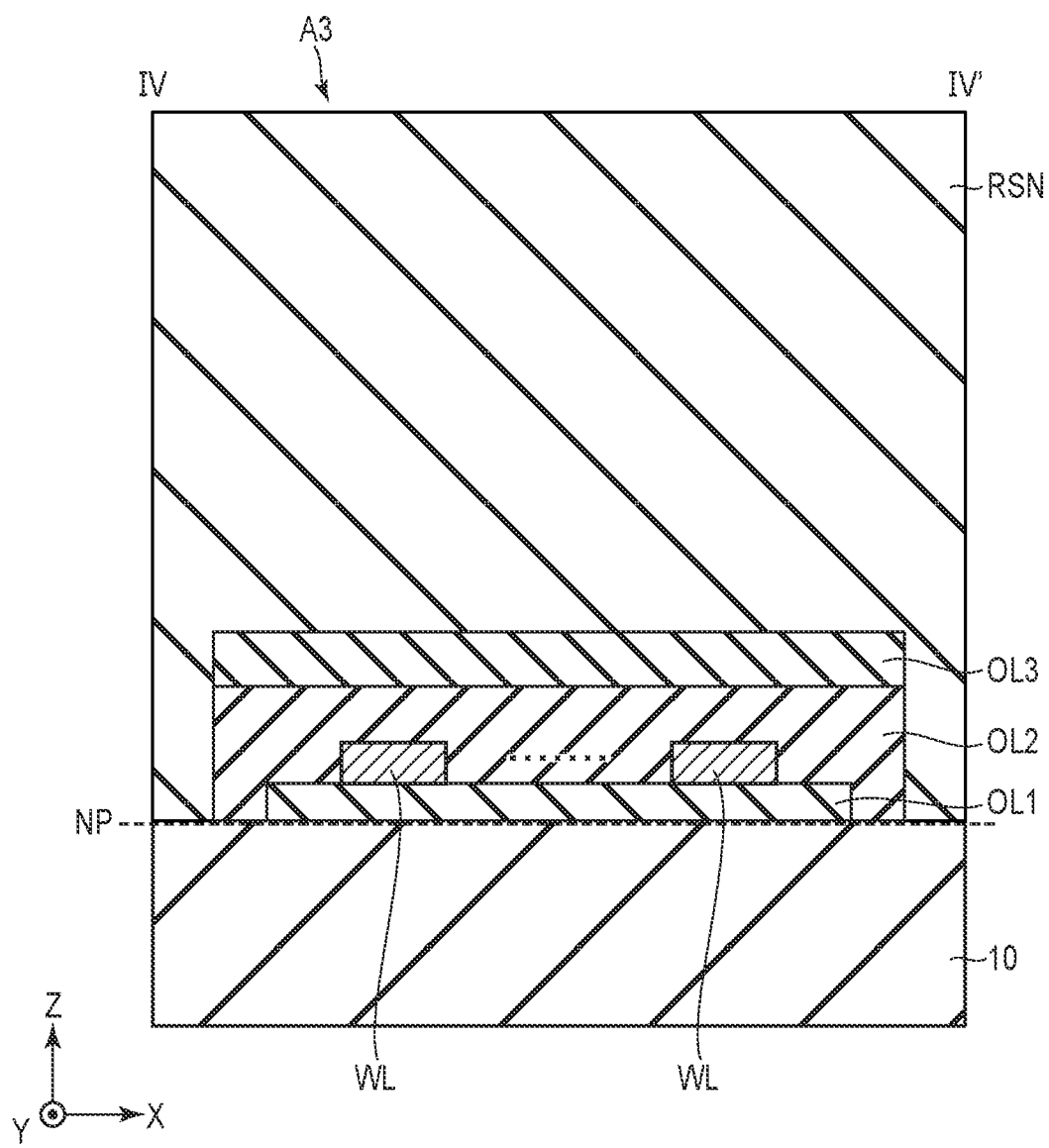
FIG. 4 is a cross-sectional view taken along line IV-IV' shown in FIG. 1.

FIG. 4 is a cross-sectional view taken along line IV-IV' shown in FIG. 1. FIG. 4 shows a surface parallel to the X-Z plane defined by the first direction X and the third direction Z. In the third area A3, the display panel 2 comprises organic layers OL1, OL2, and OL3 and a resin layer RSN in addition to the insulating substrate 10 and the lines WL.

The organic layer OL1 is located on the insulating substrate 10. The lines WL are located on the organic layer OL1 and are covered with the organic layer OL2. In the example illustrated, both end portions of the organic layer OL1 are covered with the organic layer OL2 in the first direction X. That is, the organic layer OL2 is in contact with the lines WL and the organic layer OL1 and is also in contact with the insulating substrate 10 on the both sides sandwiching the organic layer OL1. The organic layer OL3 is provided on the organic layer OL2. The resin layer RSN is provided on the organic layer OL3. In the example illustrated, the resin layer RSN is in contact with the insulating substrate 10 on the both sides sandwiching the organic layers OL1, OL2, and OL3.

The organic layers OL1, OL2, and OL3 are formed of, for example, an organic insulating material such as polyimide. To improve the adherence, the organic layer OL1 and the organic layer OL2 are desirably formed of the same material. In addition, when the organic layers are formed of polyimide, at least the organic layers OL1 and OL2, of the organic layers OL1, OL2, and OL3 desirably contain fluorine. The organic layer OL3 may contain or may not contain fluorine. When the organic layers OL1 and OL2 contain fluorine, their moisture permeability and hygroscopicity are lowered and corrosion of the lines WL arranged between the organic layer OL1 and the organic layer OL2 can be thereby suppressed. For example, the resin layer RSN is an acrylic resin and is cured by ultraviolet irradiation. Such a resin layer RSN functions as a protective layer protecting the lines WL.

Each of the Young's moduli of the organic layers OL1, OL2, and OL3 is larger than the Young's modulus of the resin layer RSN. In the above structure, a neutral surface NP in a case of folding the fold area BA is located near a boundary between the insulating substrate 10 and the organic layer OL1 as represented by a broken line in the drawing. The neutral surface NP is a surface where a tensile stress and a compressive stress are proportional to each other when the fold area BA is folded.

Figure 5:
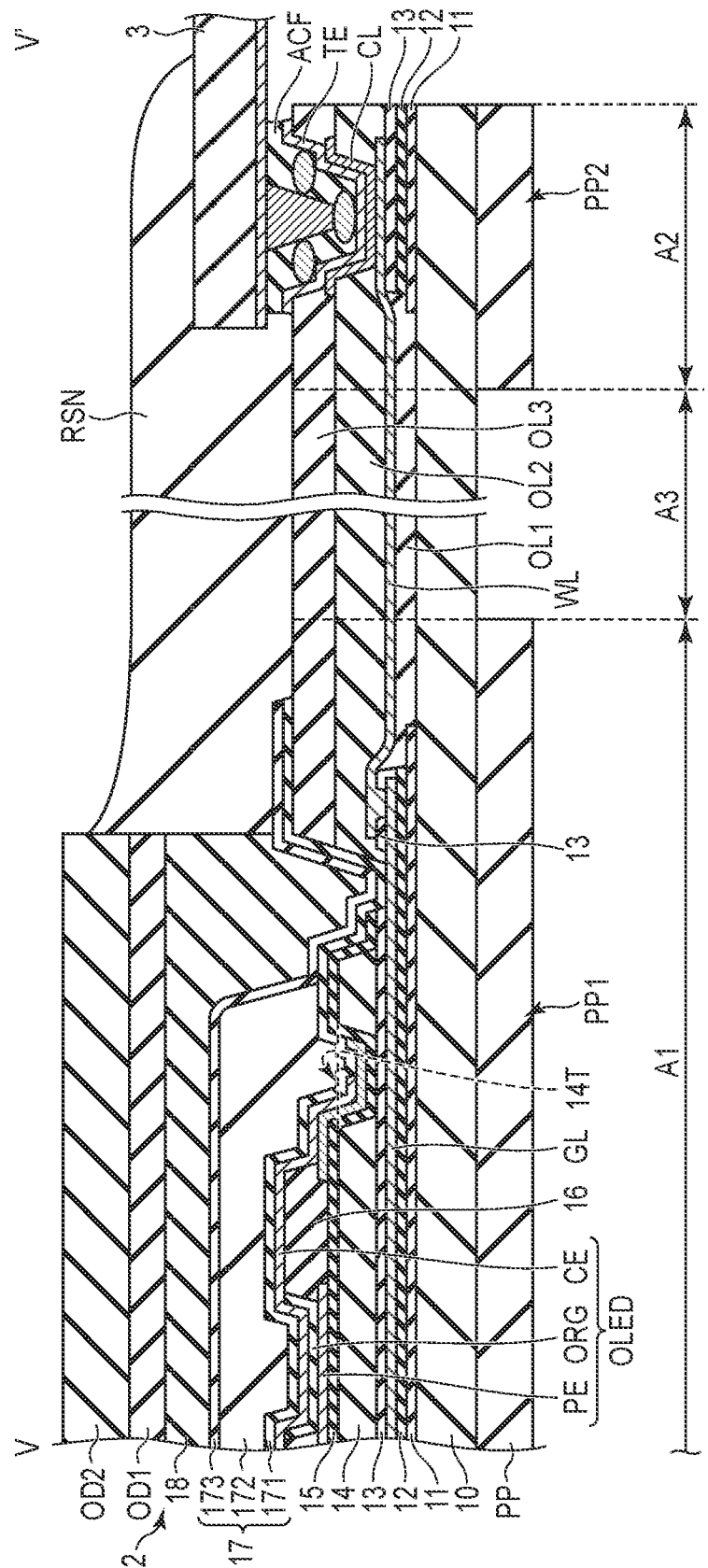
FIG. 5 is a cross-sectional view taken along line V-V' shown in FIG. 1.

FIG. 5 is a cross-sectional view taken along line V-V' shown in FIG. 1. FIG. 5 shows a surface parallel to the Y-Z plane. The first area A1, the third area A3, and the second area A2 are arranged in this order in the second direction Y. The support substrate PP1 provided in the first area A1 is the support substrate PP overlaid on the organic EL element OLED. The support substrate PP2 provided in the second area A2 is the support substrate PP overlaid on the terminal TE. Incidentally, when the third area A3 is folded, the second direction Y corresponds to the circumferential direction C shown in FIG. 2.

The display panel 2 comprises a line GL and a conductive layer CL in addition to the insulating substrate 10, the insulating layers 11 to 15, the ribs 16, the organic EL elements OLED, the sealing film 17, the adhesive layer 18, the optical elements OD1 and OD2, the line WL, the organic layers OL1, OL2, and OL3, and the terminals TE.

The insulating substrate 10 is provided across the first area A1, the second area A2, and the third area A3. The insulating layers 11 to 13 are provided in the first area A1 and the second area A2, but is not provided in the third area A3. In the example illustrated, the insulating layers 11 to 13 are removed in an area slightly wider than the third area A3. In other words, the insulating layers 11 to 13 are not provided at an end portion of the first area A1 on the third area A3 side and an end portion of the second area A2 on the third area A3 side. In the first area A1, the insulating layer 11 extends more closely to the side of the second area A2 than the insulating layers 12 and 13. In addition, in the second area A2, the insulating layer 11 extends more closely to the side of the first area A1 than the insulating layers 12 and 13.

The line GL is located on the insulating layer 12 and is covered with the insulating layer 13, in the first area A1. The line GL is electrically connected to the gate electrode GE of the switching element SW shown in FIG. 3. For example, such a line GL can be formed of the same material as the gate electrode GE of the switching element SW shown in FIG. 3, in the same steps.

The line WL extends from the end portion of the first area A1 on the third area A3 side to the second area A2. The line WL is formed on the insulating layer 13 in the first area A1 and the second area A2, and is formed on the organic layer OL1 in the third area A3. In the first area A1, the line WL is in contact with the line GL in a contact hole formed in the insulating layer 13. The line WL and the line GL are thereby electrically connected to each other. For example, the line WL can be formed of the same material as the source electrode SE and the drain electrode DE of the switching element SW shown in FIG. 3, in the same steps.

The organic layer OL1 is provided in at least the third area A3. In the example illustrated, both end portions of the organic layer OL1 in the second direction Y are located in the first area A1 and the second area A2. The organic layer OL1 is formed on the insulating substrate 10 in the third area A3. In addition, the organic layer OL1 is formed on the insulating substrate 10 and partially covers the insulating layers 11 to 13, in the first area A1 and the second area A2. Thus, the organic layer OL1 partially covers the insulating layers 11 to 13 in the first area A1 and the second area A2, and a step formed near the end portions of the insulating layers 11 to 13 is thereby reduced. Therefore, a break of the line WL formed on the insulating layer 13 and on the organic layer OL1 in the first area A1 and the second area A2 can be suppressed.

The organic layer OL2 is provided across the first area A1, the second area A2, and the third area A3, and covers the line WL. In the example illustrated, the organic layer OL2 covers the lines WL and is also in contact with the insulating layer 13 in the first area A1 and the second area A2. For example, the organic layer OL2 can be formed of the same material as the insulating layer 14 in the same steps. The organic layer OL2 has a contact hole exposing the line WL, in the second area A2. The conductive layer CL is provided inside the contact hole and is in contact with the line WL. For example, the conductive layer CL can be formed of the same material as the pixel electrode PE in the same steps.

The organic layer OL3 is provided in an area overlaid on the organic layer OL2. That is, the organic layer OL3 is provided across the first area A1, the second area A2, and the third area A3. For example, the organic layer OL3 can be formed of the same material as the rib 16 in the same steps. The organic layer OL3 has a contact hole exposing the conductive layer CL, in the second area A2. The terminal TE is provided in this contact hole and is in contact with the conductive layer CL. The terminal TE and the line WL are thereby electrically connected to each other via the conductive layer CL. For example, the terminal TE can be formed simultaneously with the common electrode CE. In the example illustrated, the terminal TE is electrically connected to the wiring substrate 3 via an anisotropic conductive film ACF.

The insulating layer 14 is provided in the first area A1 and is located on a side farther from the second area A2 than the line WL. For example, the insulating layer 14 has a groove 14T exposing the insulating layer 13. By providing the groove 14T, entry of moisture from the second area A2 side to the first area A1 side is suppressed and degradation of the organic EL element OLED is suppressed. In addition, even in a case where a crack occurs at inorganic layers 171 and 173 or the like when the third area A3 is folded, propagation of the crack to the display area DA side can be suppressed since the groove 14T an projections and depressions resulting therefrom are formed. Such a groove 14T is desirably formed in an annular shape surrounding the display area DA in planar view.

The insulating layer 15 is provided in the first area A1 and covers the entire body of the insulating layer 14. That is, the insulating layer 15 is in contact with the insulating layer 13, extends more closely to the side of the second area A2 than the insulating layer 14, and is in contact with the insulating layer 13, in the groove 14T. The organic EL element OLED and the rib 16 are located in an inner area than the groove 14T, i.e., on the side farther from the second area A2 than the groove 14T (or the display area DA side).

The sealing film 17 is provided in the first area A1, and a part thereof extends more closely to the side of the second area A2 than the insulating layer 14. More specifically, the inorganic layer 171 of the sealing film 17 extends more closely to the side of the second area A2 than the insulating layer 14 and is in contact with the organic layers OL2 and OL3. In the example illustrated, the inorganic layer 171 covers side surfaces of the organic layers OL2 and OL3 and extends to an upper part of the organic layer OL3. The organic layer 172 of the sealing film 17 is provided in an area overlaid on the insulating layer 14. The inorganic layer 173 of the sealing film 17 further extends more closely to the side of the second area A2 than the organic layer 172 and is in contact with the inorganic layer 171.

In the present embodiments, the inorganic layers 171 and 173 extend to an area overlaid on inorganic layers located under the line WL, i.e., the insulating layers 11 to 13. For example, both the inorganic layers 171 and 173 extend more closely to the side of the second area A2 than the insulating layers 11 to 13.

In the example illustrated, the insulating layers 11 to 13 and the inorganic layers 171 and 173 are overlaid on the optical elements OD1 and OD2 and extend more closely to the side of the second area A2 than the optical elements OD1 and OD2. In addition, the line WL and the organic layers OL2 and OL3 are arranged in an area of the side closer to the second area A2 than the optical elements OD1 and OD2. In the example illustrated, the line WL is not overlaid on the optical elements OD1 and OD2, but end portions of the organic layers OL2 and OL3 on the organic EL element OLED side are overlaid on the optical elements OD1 and OD2. In the area of the side closer to the second area A2 than the optical elements OD1 and OD2, the line WL and the organic layers OL2 and OL3 are sandwiched between the insulating layers 11 to 13 and the inorganic layers 171 and 173.

The resin layer RSN is provided across the first area A1, the second area A2, and the third area A3. In the first area A1, the resin layer RSN covers the organic layer OL3 and the inorganic layers 171 and 173 and is also in contact with the adhesive layer 18 and the optical elements OD1 and OD2. In the second area A2, the resin layer RSN covers the organic layer OL3 and the wiring substrate 3. In the third area A3, the resin layer RSN covers the organic layer OL3.

Incidentally, a cross-linking agent may be contained in at least the organic layer OL1 and the resin layer RSN, of the organic layers OL1, OL2, and OL3 and the resin layer RSN. In general, the display panel has a multilayer structure including various conductive layers such as lines and various insulating layers. For this reason, when the adherence between layers is weak, peeling of layers caused by the folding or a crack caused together with the peeling may occur in the fold area where the display panel is deformed so as to have the curvature. In particular, since a stress caused by the folding is easily applied to a start point of the folding (in the present embodiment, the vicinity of the boundary between the first area A1 and the third area A3), peeling of the layers easily occurs. This peeled portion can be a path of entry of moisture into the display panel.

In contrast, when a cross-linking agent is contained in the organic layer OL1, in the present embodiment, the adherence between the organic layer OL1 and the insulating substrate 10 is improved. In addition, when a cross-linking agent is contained in the resin layer RSN, the adherence between the resin layer RSN and the organic layer OL3 is improved. As a result, even when the third area A3 is folded, peeling of the organic layer OL1 and the insulating substrate and peeling of the resin layer RSN and the organic layer OL3 can be suppressed. In addition, when a cross-linking agent is contained in the resin layer RSN, the adherence between the resin layer RSN, and the optical elements OD1 and OD2, the adhesive layer 18, and the inorganic layers 171 and 173 is also improved in the first area A1. Therefore, peeling the resin layer RSN can be suppressed in the vicinity of the folding start point in the first area A1. As a result, reduction in the reliability of the display device 1 can be suppressed.

FIG. 6 is an enlarged cross-sectional view showing a vicinity of a third area A3 shown in FIG. 5. The support substrate PP1 has an end part EP1 on the second area A2 side. The support substrate PP2 has an end part EP2 on the first area A1 side. The third area A3 corresponds to an area between the end part EP1 and the end part EP2.

In the example illustrated, both an end part EI2 of the inorganic layer 171 and an end part EI3 of the inorganic layer 173 are closer to the second area A2 than both an end part EI1 of the insulating layer 11 and an end part EI4 if the insulating layers 12 and 13. In other words, each of the end parts EI1 and EI4 is overlaid on the inorganic layers 171 and 173. The end parts EI1, EI2, EI3, and EI4 are the end parts on the second area A2 side. The end parts EI1, EI2, EI3, and EI4 are located in the first area A1. That is, the end parts EI1, EI2, EI3, and EI4 are farther from the second area A2 than the end part EP1.

In the example illustrated, the position of the end part EI2 and the position of the end part EI3 are aligned in the second direction Y. Incidentally, the position of the end part EI2 and the position of the end part EI3 may be aligned with the position of the end part EI1, in the second direction Y. In addition, in the example illustrated, the end part EI1 is closer to the second area A2 than the end part EI4. In the example illustrated, the end part of the insulating layer 12 and the end part of the insulating layer 13 are aligned but may not be aligned. In this case, the end part of the insulating layer 12 is closer to the second area A2 than the end part of the insulating layer 13.

Incidentally, the insulating layers 11 to 13 are desirably formed of silicon oxide. Since silicon oxide has a larger tensile strength than silicon nitride, occurrence of a crack at the folding of the third area A3 can be suppressed.

Figure 7:
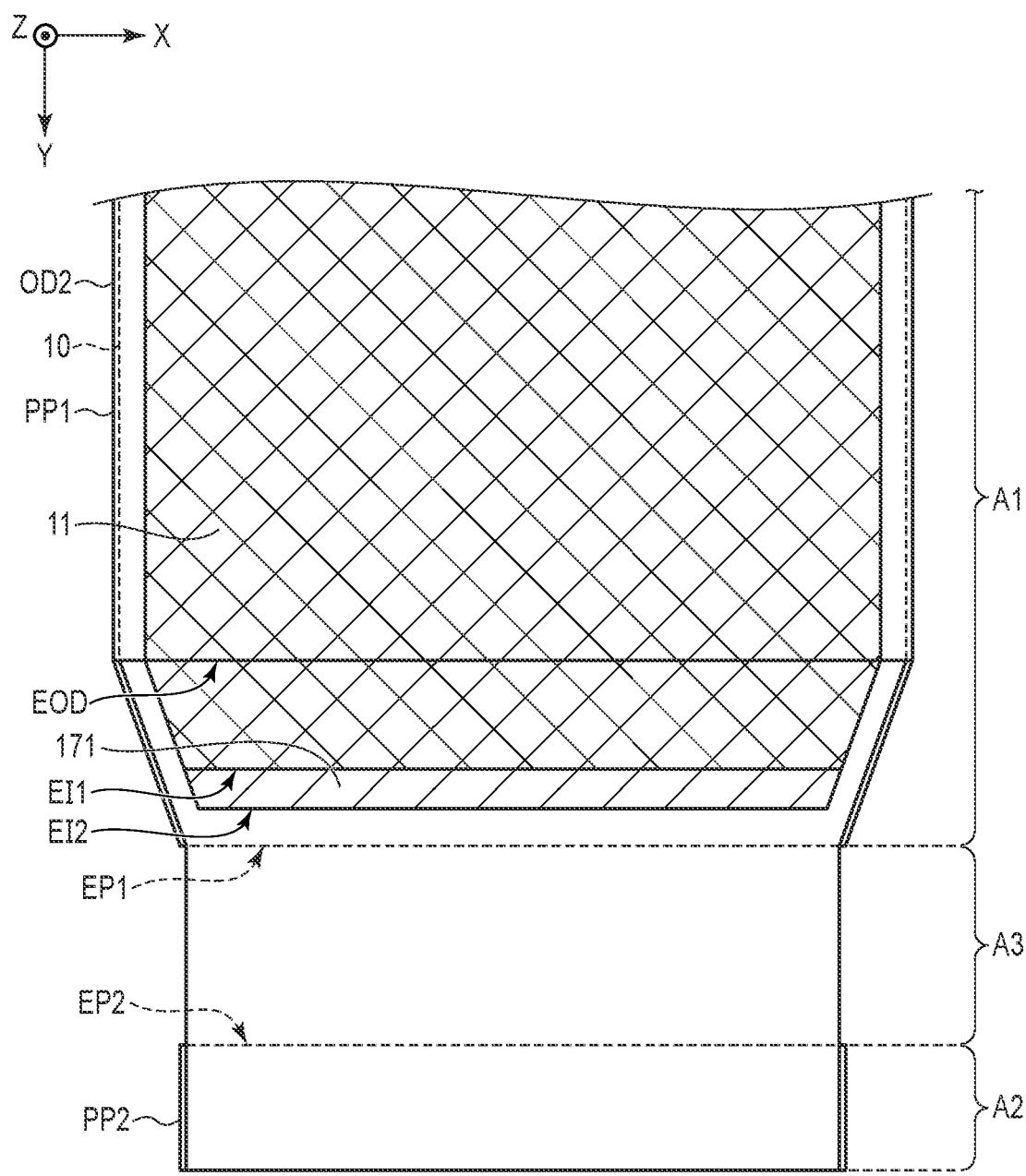
FIG. 7 is a plan view showing an area where an insulating layer 11 and an inorganic layer 171 are provided.

FIG. 7 is a plan view showing an area where an insulating layer 11 and an inorganic layer 171 are provided. As represented by right-downward diagonal hatch lines in the figure, the insulating layer 11 is provided substantially across the first area A1. In addition, as represented by right-upward diagonal hatch lines in the figure, the inorganic layer 171 is provided in an area overlaid on the insulating layer 11, and extends to the second area A2 than the insulating layer 11 in the present embodiments. That is, the end part EI2 is closer to the second area A2 than the end part EI1. For example, the end parts EI1 and EI2 extend in the first direction X.

In the example illustrated, the support substrate PP is substantially overlaid on the insulating substrate 10 except for the third area A3. That is, the shape of the support substrate PP1 is substantially the same as the shape of the first area A1, and the shape of the support substrate PP2 is substantially the same as the shape of the second area A2. For example, the end part EP1 of the support substrate PP1 and the end part EP2 of the support substrate PP2 extend in the first direction X. The end parts EI1 and EI2 are located between an end part EOD of the optical element OD2 and the end part EP1 of the support substrate PP1.

As described above, according to the present embodiments, the inorganic layers 171 and 173 extend to at least the area where the insulating layers 11 to 13 are provided, in the first area A1. In general, a coefficient of elasticity of an inorganic layer is higher than a coefficient of elasticity of an organic layer. Therefore, rigidity of the first area A1 can be increased by overlaying the insulating layers 11 to 13 composed of inorganic layers on the inorganic layers 171 and 173, in the first area A1. In contrast, the insulating layers 11 to 13 and the inorganic layers 171 and 173 are not provided in the third area A3. For this reason, the rigidity of the third area A3 is lower than the rigidity of the first area A1.

When a ratio of rigidity between the third area A3 and the first area A1 is small, there is a risk that the first area A1 which is an originally unfolded area may be curved when the third area A3 is folded. In this case, there is a risk that the line WL may be broken in the first area A1, too. According to the present embodiments, however, folding rigidity of the first area A1 can be increased relative to the folding rigidity of the third area A3 that is the fold area BA, by providing the area where the inorganic layers 171 and 173 are overlaid on the insulating layers 11 to 13 in the first area A1. As a result, curving of the first area A1 can be suppressed when the third area A3 is folded, and break of the line WL in the first area A1 can be suppressed.

Furthermore, according to the present embodiments, two organic layers OL2 and OL3 are overlaid on the line WL, and the inorganic layers 171 and 173 are provided on the organic layer OL3. That is, the inorganic layers 171 and 173 having a larger coefficient of elasticity are arranged on an upper side than the line WL (i.e., an outer peripheral side of the folding). As a result, the position of the neutral surface NP can be made to be closer to the line WL when the third area A3 is folded. Therefore, a stress in the vicinity of the line WL can be reduced when the third area A3 is folded, and the break of the line WL can be suppressed.

As a result, according to the present embodiments, the display device 1 capable of improving the reliability can be provided. The other examples of the display panel 2 will be described hereinafter with reference to FIG. 8 to FIG. 11.

Figure 8:
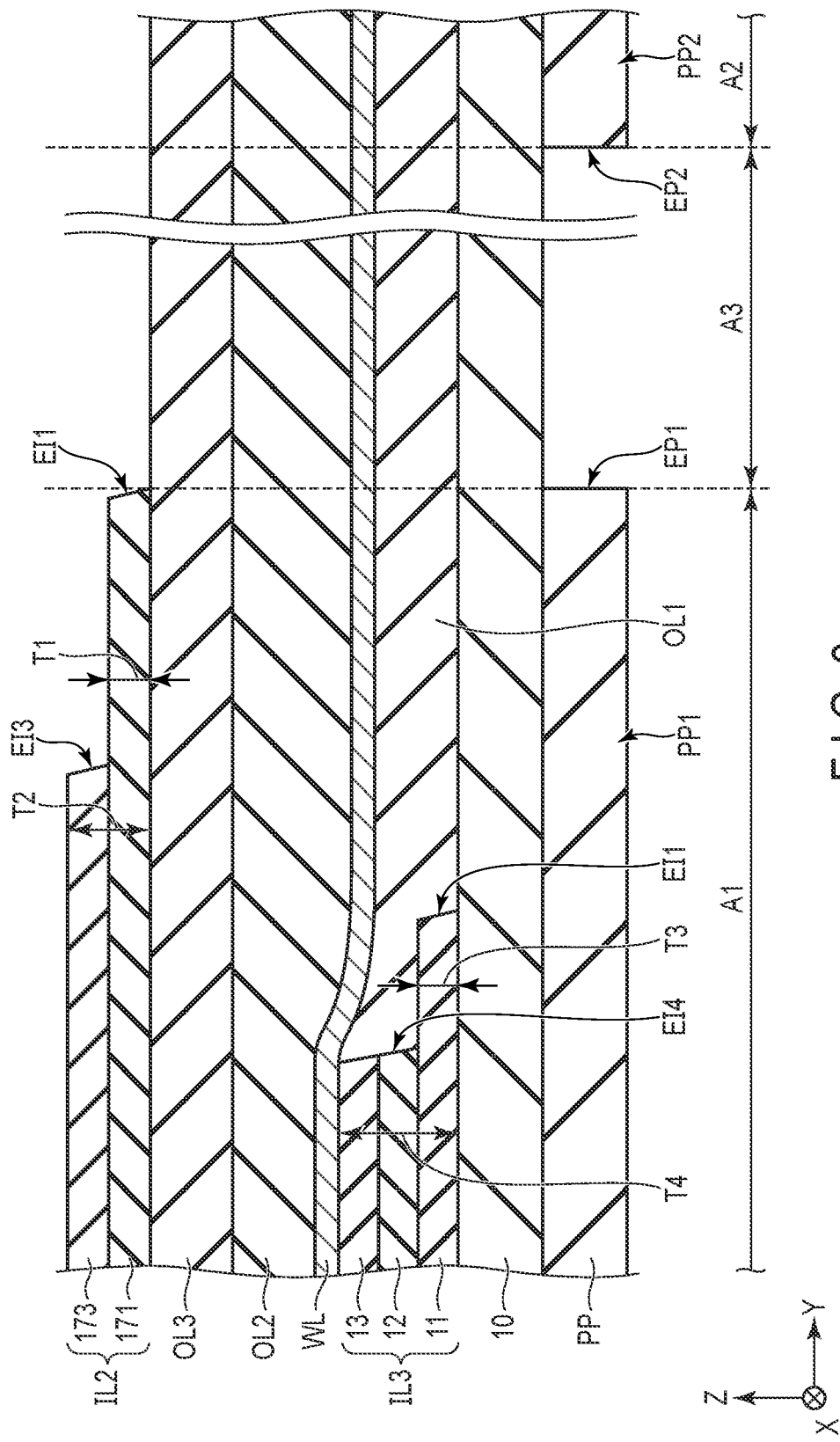
FIG. 8 is a cross-sectional view showing another example of a display panel 2.

FIG. 8 is a cross-sectional view showing another example of a display panel 2. FIG. 9 is a plan view showing the display panel 2 shown in FIG. 8. The example shown in FIG. 8 and FIG. 9 is different from the example shown in FIG. 6 and FIG. 7 with respect to a feature that the inorganic layer 171 extends more closely to the side of the second area A2 than the inorganic layer 173. In the example illustrated, the inorganic layer 171 is provided across the entire body of the first area A1. That is, the position of the end part EI2 and the position of the end part EP1 are aligned in the second direction Y.

In the following descriptions, the insulating layers 11, 12, and 13 located under the line WL are regarded as an insulating layer IL1, and the inorganic layers 171 and 173 located above the line WL are regarded as an insulating layer IL2.

In the example illustrated in FIG. 8, since the inorganic layer 171 extends more closely to the side of the second area A2 than the inorganic layer 173, the insulating layer IL2 is thinner in the vicinity of the third area A3. In other words, the thickness T1 of the insulating layer IL2 on the third area A3 side is smaller than a thickness T2 on the side farther from the third area A3 (i.e., the organic EL element OLED side). In this example, the thickness T1 corresponds to the thickness of the inorganic layer 171, and the thickness T2 corresponds to a total thickness of the inorganic layers 171 and 173. The thickness T1 is, for example, 200 nm or less. In the example illustrated, the thickness of the inorganic layer 173 is equal to the thickness T1 but may be different therefrom.

Similarly, since the insulating layer 11 extends more closely to the side of the second area A2 than the insulating layers 12 and 13, the insulating layer IL1 is thinner in the vicinity of the third area A3. In other words, a thickness T3 of the insulating layer IL1 on the third area A3 side is smaller than a thickness T4 on the side farther from the third area A3. The thickness T3 corresponds to the thickness of the insulating layer 11, and the thickness T4 corresponds to a total thickness of the insulating layers 11, 12, and 13. The thickness T3 is, for example, 200 nm or less. In the example illustrated, each of the thickness of the insulating layer 12 and the thickness of the insulating layer 13 is equal to the thickness T3 but may be different therefrom.

According to the present example, both the insulating layer IL2 located above the line WL and the insulating layer IL1 located under the line WL are thinner in the vicinity of the third area A3 that is the fold area BA and are thicker on the side farther from the third area A3. In general, as the thickness of an inorganic layer is larger, a distortion amount at the folding of the inorganic layer becomes larger and a crack may occur more easily in the inorganic layer. According to the present embodiments, occurrence of a crack in the insulating layers IL1 and IL2 at the folding of the third area A3 can be suppressed by reducing the thickness of the insulating layer IL1 and the thickness of the insulating layer IL2 in the vicinity of the fold start position of the display panel 2 (i.e., boundary between the first area A1 and the third area A3).

In addition, according to the present example, since the inorganic layer 171 is provided on the entire body of the first area A1, the rigidity of the first area A1 can be further increased. As a result, curving of the first area A1 can be suppressed when the third area A3 is folded, and break of the line WL in the first area A1 can be suppressed. Therefore, according to the present example, the display device 1 capable of improving the reliability can be provided.

Figure 10:
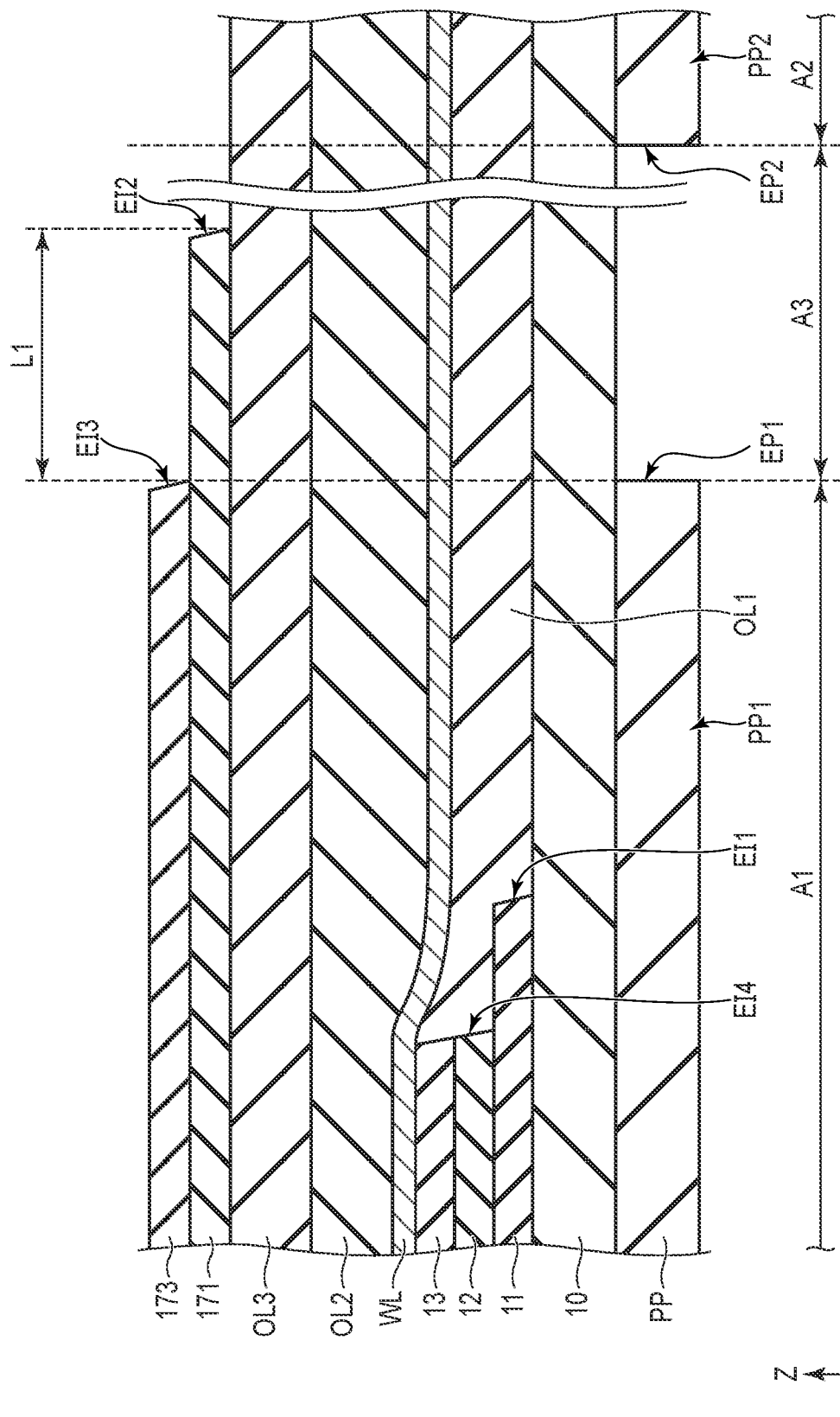
FIG. 10 is a cross-sectional view showing the other example of the display panel 2.
Figure 11:
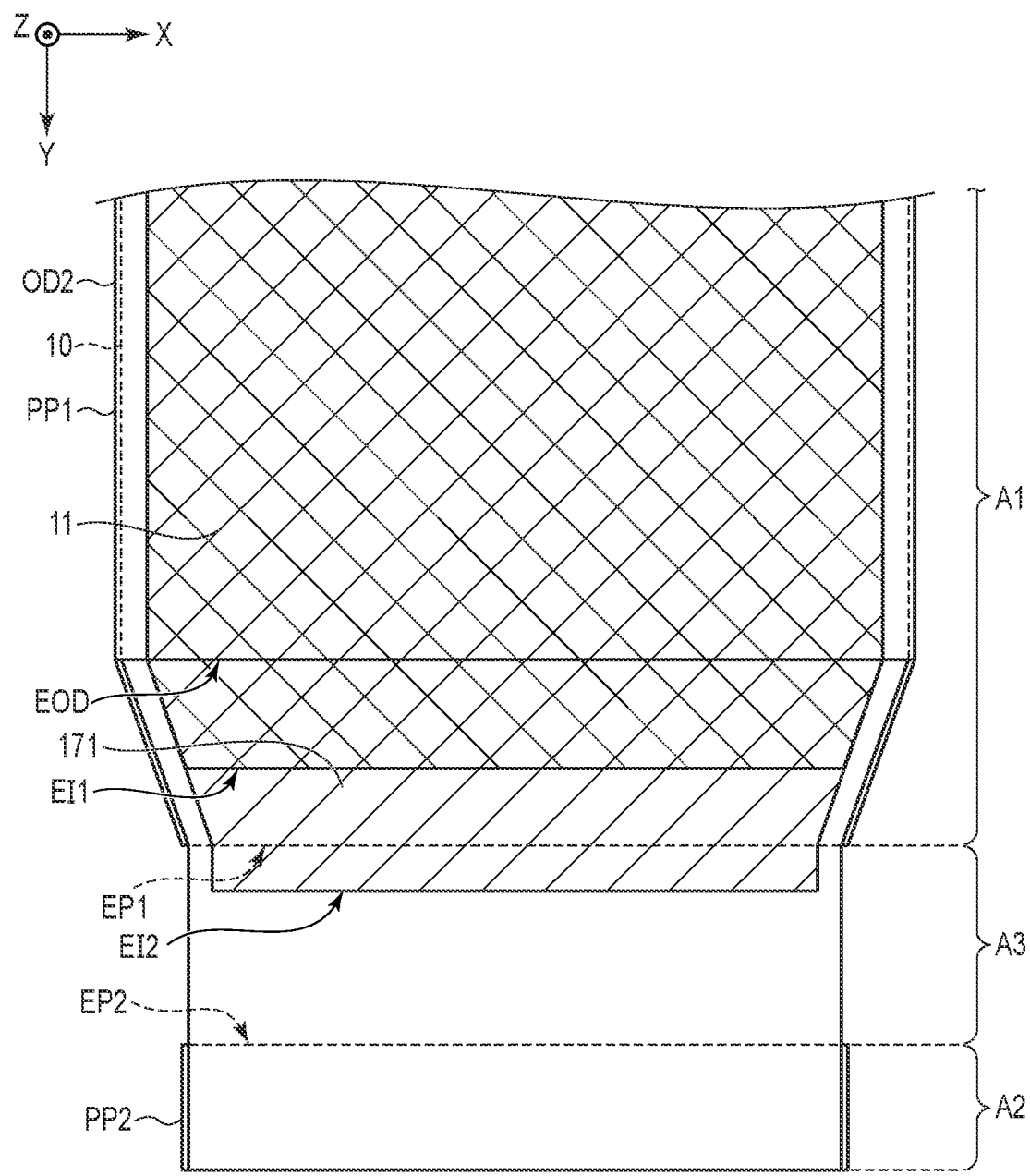
FIG. 11 is a plan view showing the display panel 2 shown in FIG. 10.

FIG. 10 is a cross-sectional view showing the other example of the display panel 2. FIG. 11 is a plan view showing the display panel 2 shown in FIG. 10. The example shown in FIG. 10 and FIG. 11 is different from the example shown in FIG. 8 and FIG. 9 with respect to a feature that the inorganic layer 171 extends to the third area A3. That is, the end part EI2 is located in the third area A3. In the present example, a length L1 of the inorganic layer 171 extending to the third area A3 is set to be 4% or less of a distortion amount when the third area A3 is folded.

In the example illustrated, the inorganic layer 173 is provided on the entire body of the first area A1. That is, the position of the end part EI3 and the position of the end part EP1 are aligned in the second direction Y. Incidentally, the end part EI3 may not exceed the third area A3 on the second area A2 side, and may is located between the end part EI1 and the end part EP1 in the second direction Y.

In the present example, too, the same advantages as those of the example shown in FIG. 8 and FIG. 9 can be obtained. In addition, since both the inorganic layer 171 and the inorganic layer 173 are provided on the entire body of the first area A1, the rigidity of the first area A1 can be further increased. Furthermore, according to the present example, since the inorganic layer 171 is provided in the third area A3, the position of the neutral surface NP in the third area A3 can be made to be closer to the line WL. A break of the line WL occurring when the third area A3 is folded can be therefore suppressed.

According to the above-described embodiments, the examples of the organic EL display device comprising the organic EL elements OLED has been described. However, the present embodiments can also be applied to a liquid crystal display device comprising a liquid crystal layer. When the display device is a liquid crystal display device, the same advantages as the above-described advantages can be obtained by, for example, making the inorganic insulating layer provided between the pixel electrode and the common electrode to the fold area BA side. In addition, the present embodiments can also be applied to a flexible substrate which comprises a functional element such as a sensor but does not comprise a display element.

In the above-described embodiments, the insulating layer 11 corresponds to the first inorganic insulating layer, the inorganic layer 171 corresponds to the second inorganic insulating layer, the inorganic layer 173 corresponds to the third inorganic insulating layer, and the insulating layer 12 corresponds to the fourth inorganic insulating layer. The end part EI1 corresponds to the first end part and the end part EI2 corresponds to the second end part. The end part EP1 of the support substrate PP1 corresponds to the third end part. The organic layer OL1 corresponds to the first organic insulating layer, the organic layer OL2 corresponds to the second organic insulating layer, and the organic layer OL3 corresponds to the third organic insulating layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a support substrate including a first support substrate overlapping a display area and a second support substrate overlapping a mount area and separated from the first support substrate;
a polarizer provided in the display area;
a substrate including a first area where the first support substrate is provided, a second area where the second support substrate is provided, and a third area located between the first area and the second area;
a first inorganic insulating layer provided on the substrate in the first area and the second area;
a first wiring provided on the first inorganic insulating layer in the first area;
a first organic insulating layer provided on the first inorganic insulating layer and the substrate and directly in contact with the substrate in the third area;
a second wiring connected to the first wiring via a contact hole in the first organic insulating layer;
a second organic insulating layer that covers the second wiring; and
a second inorganic insulating layer provided on the second organic insulating layer, wherein
the first support substrate includes an end located on a side of the third area,
the polarizer includes an end located between the display area and the end of the first support substrate,
the second inorganic insulating layer extends from the display area to a portion between the end of the polarizer and the end of the first support substrate,
the contact hole is located in the portion, and
the second inorganic insulating layer overlaps the contact hole in a plan view.

2. The display device of claim 1, wherein
the first inorganic insulating layer includes a first end part on the third area side,
the second inorganic insulating layer includes a second end part on the third area side, and
the first end part and the second end part are between the end of the polarizer and the end of the first support substrate.

3. The display device of claim 2, wherein
the second end part is between the first end part and the end of the first support substrate.

4. The display device of claim 2, wherein
the second end part is aligned with the end of the first support substrate.

5. The display device of claim 2, wherein
the first end part is located in the first area, and
the second end part is located in the third area.

6. The display device of claim 1, further comprising:
a third inorganic insulating layer located on the second inorganic insulating layer, wherein
the second inorganic insulating layer extends more closely to a side of the second area than the third inorganic insulating layer.

7. The display device of claim 6, wherein
the third inorganic insulating layer extends more closely to the second area side than the first inorganic insulating layer.

8. The display device of claim 1, further comprising:
a resin layer that covers the second inorganic insulating layer and the second organic insulating layer, wherein
the resin layer contacts the end of the polarizer.

9. The display device of claim 8, wherein
the resin layer extends from the portion to the second area.

10. The display device of claim 1, wherein
the third area is a fold area, and
the display device is folded at the third area so that the substrate sandwiches the support substrate.

* * * * *